United States Patent [19]
Abramovici et al.

[11] Patent Number: 5,625,630
[45] Date of Patent: Apr. 29, 1997

[54] INCREASING TESTABILITY BY CLOCK TRANSFORMATION

[75] Inventors: Miron Abramovici, Murray Hill, N.J.; Krishna B. Rajan, Chicago, Ill.

[73] Assignee: Lucent Technologies Inc., Murray Hill, N.J.

[21] Appl. No.: 637,026

[22] Filed: Apr. 24, 1996

[51] Int. Cl.$^6$ .................................................. G06T 11/00
[52] U.S. Cl. ......................................... 371/22.1; 371/25.1
[58] Field of Search ................................. 371/22.1, 25.1, 371/22.4, 24, 26, 28

[56] References Cited

U.S. PATENT DOCUMENTS

| | | | |
|---|---|---|---|
| 5,305,328 | 4/1994 | Motohara et al. | 371/27 |
| 5,450,415 | 9/1995 | Kamada et al. | 371/22.3 |
| 5,513,123 | 4/1996 | Dey et al. | 364/489 |

OTHER PUBLICATIONS

T. E. Marchok et al., "Complexity of Sequential ATPG," *Proc. European Design & Test Conf.*, 1995, pp. 1–10.

K. L. Einspahr et al., "Clock Partitioning for Testability," *IEEE Computer Society Press*, Los Alamitos, California, Mar. 5–6, Third Great Lakes Symposium on VLSI, pp. 42–46.

V. D. Agrawal et al., "Design for Testability and Test Generation with Two Clocks," *Proc. of the Fourth CSI/IEEE Int'l Symp. on VLSI Design*, India, Jan. 4–8, 1991, pp. 112–117.

K. L. Einspahr et al., "Improving Circuit Testability by Clock Control," *Proc. 6th Great Lakes Symp.*, 1996, pp. 1–6.

W-C. Fang et al., "Clock Grouping: A Low Cost DFT Methodology for Delay Testing," *31st ACM/IEEE Design Automation Conference*, 1994, pp. 94–99.

P. S. Parikh, "On Combining Design For Testability Techniques," *IEEE International Test Conference*, 1995, pp. 423–429.

J. Monteiro et al., "A Methodology for Efficient Estimation of Switching Activity in Sequential Logic Circuits",:*31st ACM/IEEE Design Automation Conference*, 1994, pp. 12–17.

D. E. Long et al., "Identifying Sequentially Untestable Faults Using Illegal States," *IEEE*, 1995, pp. 4–11.

S. Baeg et al., "Hybrid Design For Testability Combining Scan and Clock Line Control and Method For Test Generation," *IEEE International Test Conference*, 1994, pp. 340–349.

*Primary Examiner*—Vincent P. Canney
*Attorney, Agent, or Firm*—Kenneth M. Brown

[57] ABSTRACT

A method of increasing the testability of sequential circuit designs with use of a clock transformation technique. Circuit states which are difficult to reach, but are nonetheless required to detect at least one fault of the circuit, are automatically identified. In accordance with one illustrative embodiment, estimations of joint line probabilities are compared with a preselected threshold value to identify hard-to-reach states. Then, commonly clocked flip-flops which must be simultaneously assigned values in order to reach the identified states are partitioned into independently clocked groups of flip-flops. In this manner, hard-to-reach circuit states are transformed into easy-to-reach states, which, in turn, results in transforming difficult-to-detect faults into easy-to-detect faults.

10 Claims, 3 Drawing Sheets

FIG. 1
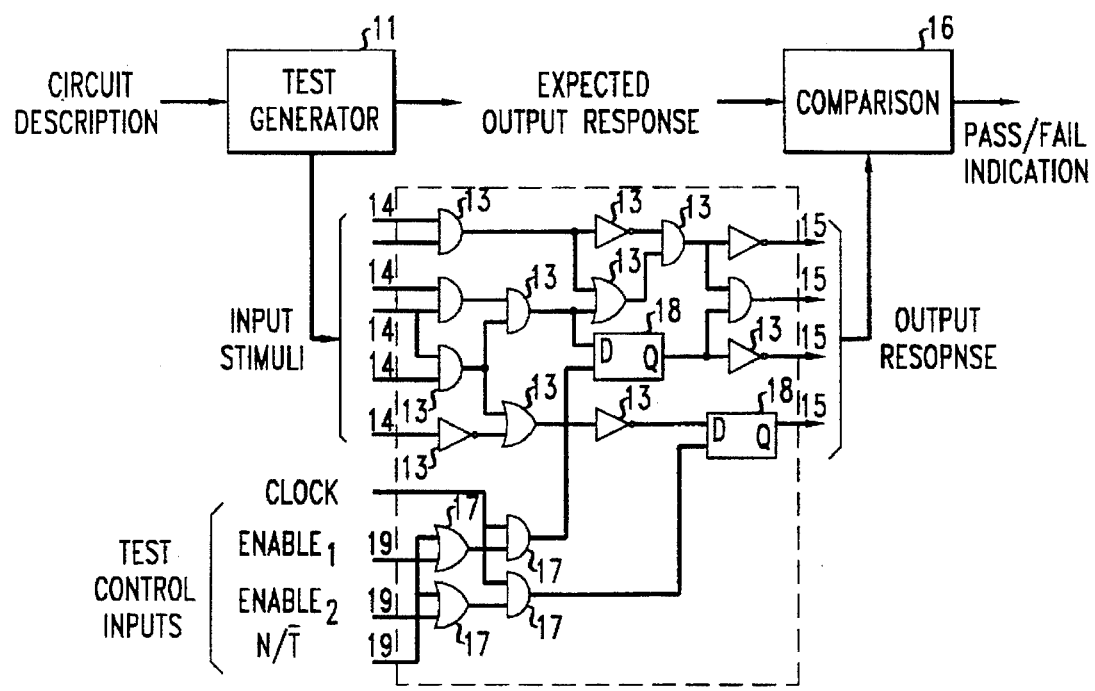
FIG. 2
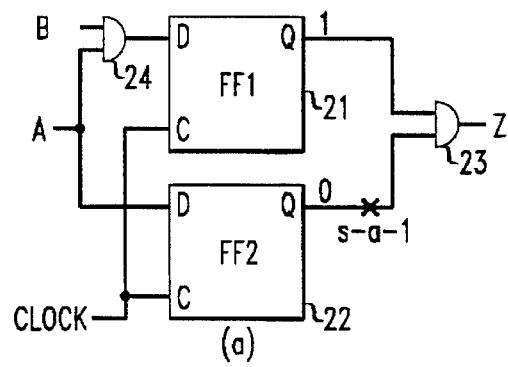
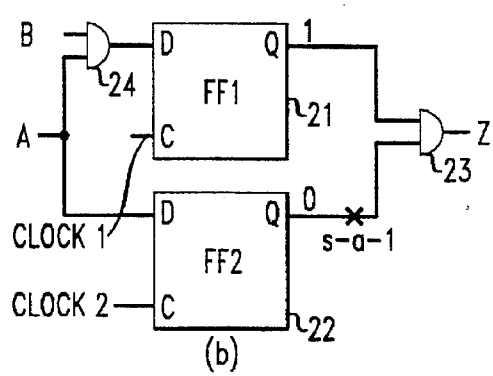
FIG. 3
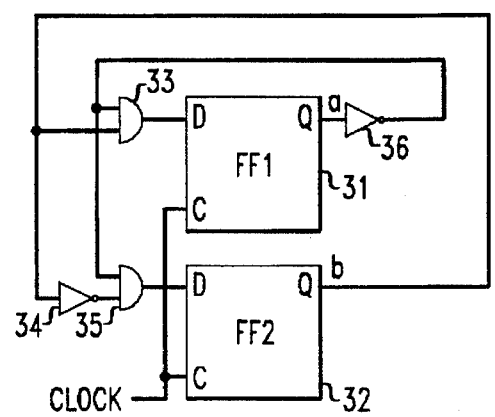

INCREASING TESTABILITY BY CLOCK TRANSFORMATION

FIELD OF THE INVENTION

The present invention relates generally to the field of automatic test generation (ATG) for sequential digital logic circuits (i.e., sequential test generation or STG) and more particularly to a design for testability (DFT) method for increasing the testability of such circuits.

BACKGROUND OF THE INVENTION

The problem of adequately testing digital logic circuits has grown substantially more complex over the years with the rapid increase in the complexity of the logic circuits being designed and fabricated. Most modern approaches to this problem involve the use of sequential test generation (STG) systems which are charged with the task of automatically generating a comprehensive test plan for a given sequential circuit design. Such an STG system is provided with a description of the circuit design, typically in terms of its constituent circuit elements (e.g., logic gates and flip-flops) and the interconnections among those elements and to the circuit's primary inputs and primary outputs. The STG system then automatically generates circuit stimuli which, when applied to the primary inputs of a fabricated instance of the given circuit design, will result in a response at the circuit's primary outputs which will identify (with a reasonable degree of certainty) whether the fabricated circuit is operating in accordance with the given circuit design.

Since the number of possible malfunctions which a fabricated circuit may theoretically exhibit is extremely large, STG systems typically perform their task (and measure the quality of their result) based on a fault "model" in which only a comparatively small number of possible malfunctions are considered. The most common such model, the "stuck-at" fault model, enumerates the set of malfunctions in which each circuit lead (i.e., each input to and each output from a circuit element) may be individually "stuck" at one of its possible values (e.g., logic 0 or logic 1). In this manner, the number of possible faults to be considered is limited to twice the number of circuit leads. The "stuck-at" fault model has become well accepted as providing a reasonable correspondence to the set of likely physical errors which typically result from the fabrication process.

Most STG systems select one of the modelled faults at a time, and attempt to generate tests (i.e., circuit stimuli) which will be able to "detect" that fault. That is, the system's goal is to find circuit stimuli which, when applied to the primary inputs of a "defective" circuit (i.e., one which has the given fault), will result in a response at the circuit's primary outputs which differs from that of a properly operational circuit. Usually, these circuit stimuli am generated as a result of an exhaustive search procedure involving substantial trial and error. For most typical circuit designs, however, quite a few of the faults may be extremely difficult to detect, making STG a very complex and time-consuming problem.

Much of the attention in the field of test generation, therefore, has focused on the problem of circuit "testability." In other words, STG can be made easier by modifying the circuit to be tested so as to improve its testability, without affecting the (normal) operation of the circuit. Specifically, the testability problem can be alleviated by applying certain Design for Testability (DFT) techniques in the circuit design. The two most popular DFT techniques are referred to as "full scan" and "partial scan" design. Using full scan, all the circuit flip-flops are replaced by scanable flip-flops which are connected so as to operate like a shift register during testing. In partial scan, only a subset of the flip-flops are transformed into scan flip-flops, reducing the fabricated circuit area overhead and possibly avoiding delay penalties by not scanning the flip-flops on the critical paths. But in many circuits, a large fraction of flip-flops need to be scanned to achieve a high fault coverage, and in synthesized circuits, a large percentage of paths are critical. Moreover, an expensive sequential test generator needs to be employed. Another drawback of scan techniques is the large test application time, resulting from the fact that every test vector to be applied needs to be scanned in through a series of flip-flops.

Recently, several DFT techniques based on controlling the clock have been proposed. For example, in V. D. Agrawal, S. C. Seth, and J. S. Deogun, "Design for Testability and Test Generation with Two Clocks", Proc. 4th Int'l. Symp. on VLSI Design, pp. 44–51, January 1991, the flip-flops are partitioned into two groups controlled by independent clocks during testing. That is, while the common flip-flop clock remains commonly operable during normal circuit operation, the flip-flop groups may be independently clocked when the circuit is in a test mode of operation. In K. L. Einspahr, S. C. Seth, and V. D. Agrawal, "Clock Partitioning for Testability", Proc. 3rd Great Lakes Symp. on VLSI, pp. 42–46, March 1993, the above concept is generalized to multiple groups. Specifically, the flip-flops are divided so that flip-flops in a loop (of length greater than one) are split between two or more groups. The main advantage of this method is that global feedback can be logically cut by keeping the corresponding clock inactive. However, this technique is inconsistent across circuits, because it targets only their cyclic structure. Moreover, it is not applicable to circuits having only self-loops. And in K. L. Einspahr, S. C. Seth, and V. D. Agrawal, "Improving Circuit Testability by Clock Control", Proc. 6th Great Lakes Symp. on VLSI, 1996, the same authors combine independent clock groups with partial scan to achieve full controllability for all flip-flops.

In S. H. Baeg and W. A. Rogers, "A New Design for Testability Method: Clock Line Control Design", Proc. Custom Integrated Circuits Conf., pp. 26.2.1–26.2.4, 1993, the flip-flops are also partitioned into different groups with independent clocks during testing—however, in this case, all flip-flops within a loop are kept in the same group. Thus, test generation is simplified because there are no loops among groups. Unfortunately, there are several drawbacks to this approach. On the one hand, if the circuit has many self-loops, the number of partitions increases and thus the area overhead and test application time increase proportionally. On the other hand, the presence of a loop covering all flip-flops results in no partitioning at all, making the technique inapplicable. Because of the partitioning objective, the designer cannot control the amount of DFT that can be applied. Also, a specialized test generator is necessary to take advantage of the partitioning.

SUMMARY OF THE INVENTION

The present invention provides for a method of increasing the testability of sequential circuit designs with use of a clock transformation technique which avoids the limitations of the prior art. Specifically, and in accordance with the present invention, circuit states which are difficult to reach, but are nonetheless required to detect at least one fault of the circuit, are identified. In accordance with one illustrative embodiment of the present invention, such hard-to-reach states are identified by estimating joint line probabilities for each pair of flip-flops in the circuit, and then comparing these probability estimates to a preselected threshold value. Once hard-to-reach but needed states have been identified, flip-flops controlled by common clock lines and which must be simultaneously assigned values in order to reach these states are partitioned into independently clocked groups of flip-flops. In this manner, these hard-to-reach and needed states are transformed into easy-to-reach states, which, in turn, results in transforming difficult-to-detect faults into easy-to-detect faults.

BRIEF DESCRIPTION OF THE DRAWINGS

FIG. 1 shows an illustrative testing process for a sequential logic circuit which has been advantageously re-designed for increased testability with use of an illustrative embodiment of the method of the present invention.

FIG. 2A shows an example circuit to which the method of the present invention may be advantageously applied.

FIG. 2B shows the example circuit of FIG. 2A after it has been advantageously re-designed for testability with use of an illustrative embodiment of the method of the present invention.

FIG. 3 shows an example circuit in which state probabilities may be estimated in accordance with an illustrative embodiment of the method of the present invention.

DETAILED DESCRIPTION

Figure 4:
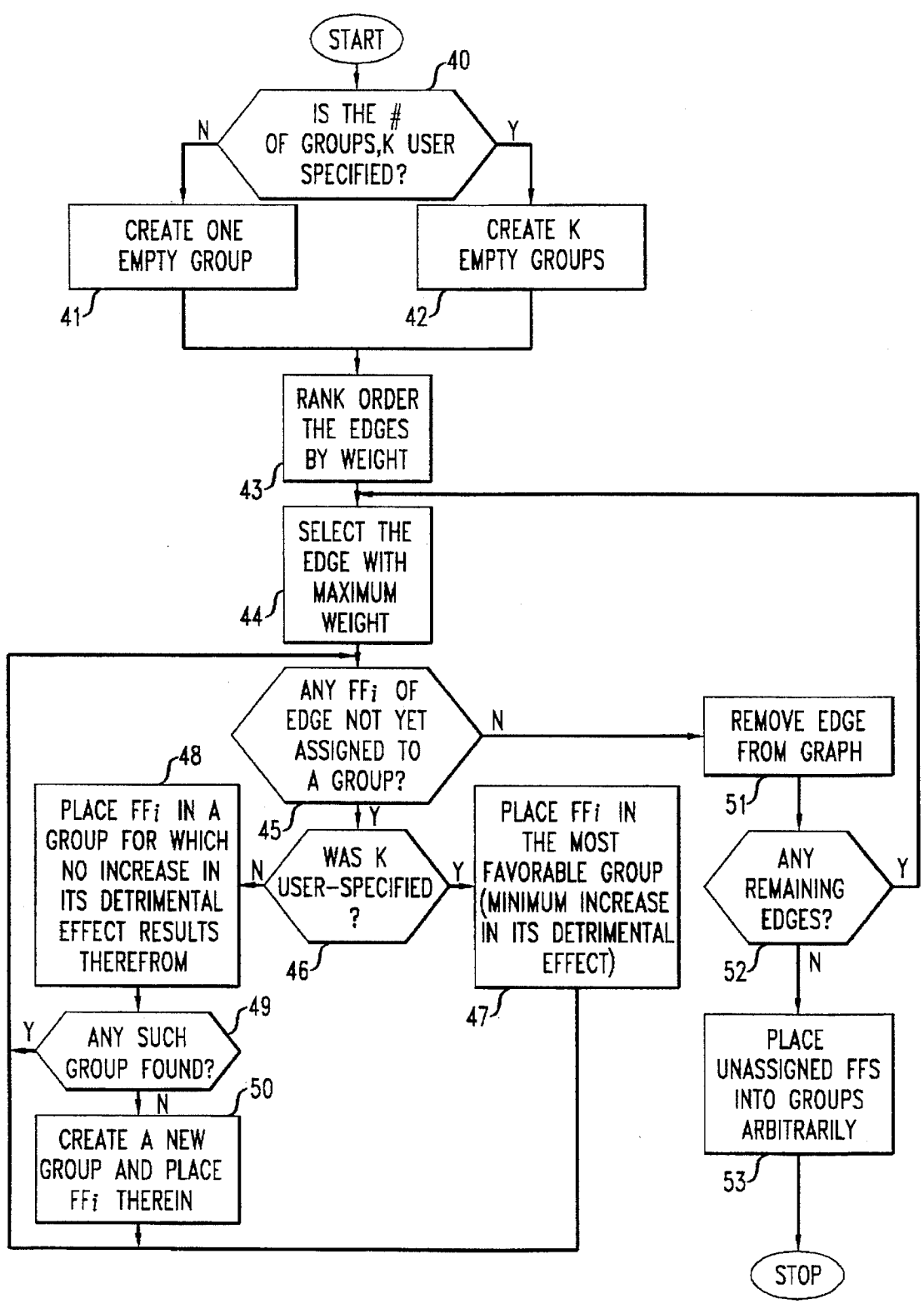
FIG. 4 shows a flow chart of an illustrative partitioning procedure in accordance with one illustrative embodiment of the present invention.

FIG. 1 shows an illustrative testing process for a sequential logic circuit which has been advantageously re-designed for increased testability with use of an illustrative embodiment of the method of the present invention. In particular, test generator 11 generates input stimuli and a corresponding expected output response based on a circuit description of the sequential circuit to be tested. Specifically, the circuit design has been advantageously modified in accordance with an illustrative embodiment of the method of the present invention, as shown, for example, in FIG. 4, below. Test generator 11 may, for example, comprise a general purpose computer system and software executing thereon. Each fabricated instance of circuit 12 comprises a plurality of interconnected circuit elements (e.g., gates 13 and flip-flops 18), one or more primary inputs 14 and one or more primary outputs 15.

When a given fabricated instance of circuit 12 is to be tested, the input stimuli generated by test generator 11 are applied to primary inputs 14 of circuit 12, and the resultant output response is measured on primary outputs 15. The resultant output response is compared with the expected output response (which was generated by test generator 11) by comparison circuit 16, thereby identifying faulty instances of the circuit. The testing process described herein is most commonly performed by a computer-controlled system known generically as Automatic Test Equipment (ATE). A typical ATE system comprises hardware components (in addition to the controlling computer) which are adapted to apply stimuli to a fabricated instance of a circuit, measure the responses from the fabricated instance of the circuit, and compare the measured response to a predetermined expected response. The fabricated instance of the circuit to be tested is usually "plugged into" the ATE system by means of a standardized interface.

In accordance with the present invention, the original design of circuit 12 has been modified so as to add circuit elements 17, three "test control inputs," and the interconnections associated therewith. (In the original circuit design, the "CLOCK" primary input had been directly connected to the clock inputs of flip-flops 18.) In this manner, the two flip-flops (18) may be made independently controllable when the circuit is placed in a special "test mode" with use of the added N/T (i.e., normal mode/not test mode) primary input. In particular, the input stimuli generated by test generator 11 places the circuit in the test mode, and then operates the "enable" primary inputs so as to advantageously allow for independent clocking of the flip-flops as determined by the test generation process. By providing such a modified circuit design in accordance with the present invention, test generator 11 can more effectively generate an efficient high quality test for sequential circuit 12.

In any sequential circuit, such as circuit 12 of FIG. 1, flip-flops are driven by some (combinational) logic whose inputs consist of primary inputs and/or outputs of other flip-flops. The values of all of the flip-flops in the circuit define what is referred to as the "state" of the circuit. In general, some states are more difficult to reach than others. (That is, some combinations of flip-flop values may be difficult to achieve.) In the extreme case, there may be unreachable states, also referred to as "illegal" states. Hard-to-reach-states and illegal states collectively will be referred to herein as hard states. Specifically, hard states are caused by the need to drive correlated values into flip-flops which are controlled by a common clock. Clearly, any fault whose detection requires the circuit to enter a hard state is necessarily difficult to detect—that is, it is difficult to generate a test for such a fault. If the hard state is, in fact, illegal, then the fault is undetectable (i.e., it is impossible to generate a test for the fault). In accordance with the DFT method of the present invention, the detrimental correlation between flip-flops which results in difficult-to-detect faults is advantageously cancelled by transforming the common clocking into independent clocking during testing.

By way of further illustration, consider the simple example circuit shown in FIG. 2A. When both flip-flops (flip-flop 21 and flip-flop 22) share a common clock as in the figure, (Q1,Q2)=(1,0) is an illegal state. However, achieving this state is a necessary condition for detecting the fault Q2 stuck-at-1 (denoted as Q2-1 ). Therefore, even though (Q1, Q2)=(1,0) is a hard (actually, in this case, illegal) state, it is needed for the detection of at least one fault, thereby making the detection of that fault difficult (actually, in this case, impossible).

However, if the circuit of FIG. 2A were modified as shown in FIG. 2B, the problem is alleviated. That is, by controlling flip-flop 21 by (independent) CLOCK1 and flip-flop 22 by (independent) CLOCK2 during testing, state (Q1,Q2)=(1,0) becomes easily reachable, and fault Q2-1 becomes detectable. For example, one way of reaching state (Q1,Q2)=(1,0) is to apply a logic 1 on primary input "A," activate CLOCK1 while holding CLOCK2 inactive, and then apply a logic 0 on primary input "A," activating CLOCK2 while holding CLOCK1 inactive. Thus, separating the clocks of the two flip-flops allows them to be loaded at different times, canceling their detrimental correlation which caused the existence of the hard state.

In accordance with the present invention, detrimental relations among flip-flops are identified by finding hard states which are needed for the detection of faults. In accordance with one illustrative embodiment, hard states are identified by analyzing each pair of flip-flops which are controlled by the same clock, and estimating the probability of obtaining each of the four possible combination of logic values (00, 01, 10, and 11) by a procedure described in detail below. (Such a probability of two or more lines of a circuit having a given set of values is known as a "joint line probability.") States whose probability measure is below a preselected threshold value am advantageously characterized as hard states. Note that in a circuit with "n" flip-flops, a state defined by a combination of two flip-flop values actually represents a group of $2^{n-2}$ possible circuit states with similar properties (i.e., all states having the particular two values on the given two flip-flops in combination with one of the possible sets of values on the other n–2 flip-flops). The word "state" will be used herein to denote such a group of states. By using this concept of a state (which is actually a group of states), it is not necessary to deal explicitly with each of the $2^n$ states of the circuit.

Note that, in general, there may be a state defined by a combination of three (or more) flip-flop values which is in fact hard, whereas no state defined by any pair of these flip-flop values by themselves is hard. Since, in accordance with the particular illustrative embodiment of the present invention described in detail herein, only pairs of flip-flops are analyzed, such hard states will not be identified. However, by dealing with only pairs (and not triples or larger n-tuples) of flip-flops, the complexity of the analysis is advantageously kept within reasonable bounds (i.e., a complexity measure of $O(n^2)$ rather than a complexity measure of $O(2^n)$, which would be the resultant complexity of analyzing all possible n-tuples of flip-flops). Alternative embodiments of the present invention in which the illustrative embodiment described herein is extended so as to also analyze higher order n-tuples of flip-flops will be obvious to those skilled in the art.

To find out which hard states are actually needed in the test generation process, it is necessary to determine the hard states that are required for detecting one or more faults. Conventional procedures are available for making such a determination. For example, in D. E. Long, M. A. Iyer and M. Abramovici, "Identifying Sequentially Untestable Faults Using Illegal States," VLSI Test Symposium, pp. 4–11, May 1995, a procedure is described which, when given a combination of (e.g., flip-flop) values, finds faults in the circuit that require this combination of values as a necessary condition for their detection. This method is based on simple implications of uncontrollability and unobservability values, familiar to those of ordinary skill in the art, where the implications are performed over several time frames. In particular, it has been shown that this method is efficient and practical for large circuits. Thus, in accordance with the illustrative embodiment of the present invention herein described, the method described in "Identifying Sequentially Unrestable Faults Using Illegal States" is employed to identify faults which are difficult to detect because their detection requires the establishment of a hard state. Any hard state required to detect at least one fault is considered to be "hard and needed." (The method described in "Identifying Sequentially Unrestable Faults Using Illegal States" is also described in commonly assigned U.S. patent application Ser. No. 08/599,289, "Method for Identifying Unrestable and Redundant Faults in Sequential Logic Circuits," now allowed. U.S. patent application Ser. No. 08/599,289 is hereby incorporated by reference as if fully set forth herein.)

The "detrimental effect" of having the same clock feeding a pair of flip-flops depends both on the probability of the hard and needed states involving the two flip-flops, and on the number of difficult faults requiring these states. In accordance with an illustrative embodiment of the present invention, a partitioning procedure uses this information to assign flip-flops into different groups, so that the total detrimental effect of any common clocking is advantageously minimized. Specifically, this illustrative embodiment advantageously identifies hard and needed states caused by sequentially reconvergent fanout (some hard and needed states may also be caused by loops—in alternative embodiments of the present invention these states may also be advantageously identified). That is, common logic which feeds flip-flops with the same clock creates correlations that may lead to hard states, and the interaction between the reconverging paths may make the detection of certain faults dependent on those hard states. Note that not every sequential reconvergence is detrimental, but, rather, only those which cause hard and needed states. Hence identifying hard and needed states implicitly identifies detrimental sequential reconvergence, without, for example, requiring an expensive explicit analysis of sequentially reconvergent paths.

Turning to the issue of the measure of correlation between flip-flops that may be used when partitioning flip-flops into clock groups, in accordance with one illustrative embodiment of the present invention, the correlation measure is based on the joint line probabilities for pairs of flip-flop outputs. However, since computing joint line probabilities precisely is computationally complex, the following approximate method is advantageously used.

Let f be a boolean function. Suppose that a random value is independently assigned to each variable x upon which f depends. Let $P_x$ be the probability that x is assigned a logic 1. There is a particular probability that f will evaluate to a logic 1 for such a randomly chosen valuation of the variables. Denote this probability |f|, and call it "the probability off." If f is represented as a binary decision diagram (BDD), familiar to those of ordinary skill in the art, then the probability off can be computed in one pass over the BDD using the following relations:

|0|=0, |1|=1, and, if $f = x \cdot f_1 + \bar{x} \cdot f_0$, the probability of f is $|f| = p_x |f_1| + (1 - p_x)|f_0|$.

In accordance with an illustrative embodiment of the present invention, this computation may be advantageously performed when f is the logic driving one of the flip-flops in the circuit. For the computation, the line probabilities of the primary inputs and of the flip-flop outputs are supplied as inputs. It may be assumed that the primary input probabilities are given (e.g., without additional information, the primary input probabilities may be assumed to be independent and uniform—thus, $p_x$ may be assigned a value of 0.5 when x is a primary input), and the flip-flop output probabilities may be advantageously estimated using conventional techniques such as that presented in J. Monteiro, S. Devadas, and B. Lin, "A Methodology for Efficient Estimation of Switching Activity in Sequential Logic Circuits," Proc. 31st Design Automation Conf., pp. 12–17, 1994 and described below. ("A Methodology for Efficient Estimation of Switching Activity in Sequential Logic Circuits" is hereby incorporated by reference as if fully set forth herein.)

Specifically, the technique of "A Methodology for Efficient Estimation of Switching Activity in Sequential Logic Circuits" comprises the following:

Given a candidate set of flip-flop probabilities, $p_q$, it can be determined whether the given set is self-consistent as follows. Let f be the boolean function of the logic driving the flip-flop represented by q. Then $p_q=|f|$. By expressing this requirement for every flip-flop, a (non-linear) system of equations involving the line probabilities is obtained. Then any one of a number of conventional iterative methods, familiar to those skilled in the art, may be used to solve the resultant system of equations, thereby resulting in a complete set of estimated flip-flop line probabilities. Note, however, that if the primary inputs are assumed to be independent, and even if that assumption of independence for the primary inputs is correct, the actual line probabilities may not be an exact solution to this system of equations. Nevertheless, the line probabilities estimated using the above described method are reasonably accurate, thereby producing adequate estimates for use in the illustrative method of the present invention.

As an example, consider the modulo-3 counter shown in FIG. 3. It can clearly be seen that (Q1,Q2)=(1,1) is an illegal state, and that the actual (i.e., precise) values of $p_a$ and $p_b$ are $p_a=p_b=\frac{1}{3}$. In accordance with the illustrative embodiment of the present invention, a system of equations corresponding to this circuit may be determined, the equations being: $p_a=(1-p_a)p_b$; $p_b=(1-p_a)(1-p_b)$. This system of equations may be solved to get:

$$p_a = 1 - (\sqrt{2}/2); p_b = \sqrt{2} - 1. \qquad (1)$$

Assume that the line probabilities have been calculated in the manner described above. Let f and g be functions representing the inputs to the two flip-flops. Then, the joint probability of both of these flip-flops simultaneously being a logic 1 may be approximated by |f.g|. In this approximation, the only correlation between the flip-flops comes from correlations in the combinational logic driving them. (Note, however, that the sequential behavior of the circuit is captured by the computation of flip-flop probabilities). Similar computations may be performed for the other combinations of values (e.g., the joint probability of the two flip-flops having the values 1 and 0, respectively, for example, may be approximated by $|f.\bar{g}|$). When the combinational logic cannot produce a certain combination, its probability will advantageously result in an estimated value of 0, thereby enabling the identification of some of the illegal states in the circuit.

For the example circuit shown in FIG. 3, the joint probabilities may be calculated to be as follows: (Q1,Q2)=(1,1), which is an illegal state, has probability 0; (Q1,Q2)=(0,1) has probability $$\sqrt{2} - 1, \qquad (2)$$

and (Q1,Q2)=(1,0) and (Q1,Q2)=(0,0) each have probability $$1 - (\sqrt{2}/2). \qquad (3)$$

The first of the above probabilities (i.e., 0) is correct, while the precise value for the probability of each of the latter three combinations is actually ⅓. In general, there may be situations where BDDs cannot be built for some of the flip-flops in a given circuit —in such a case a flip-flop probability of 0.5 may be arbitrarily assumed, although this assumption may result in not identifying some of the hard states.

In one alternative embodiment of the present invention, flip-flop probabilities may be computed by conventional simulation techniques using random input vectors. That is a large number of randomly chosen input vectors are applied to the circuit, and for each flip-flop, the frequency with which the flip-flop obtains each of the two logic values is determined. Such simulation techniques are familiar to those of ordinary skill in the art.

Given that the probability $P_S$ of state S has been estimated, it may then be used as a measure of the difficulty of reaching state S. For example, if $P_s=0$, then S is an illegal state. S is said be hard (i.e., difficult-to-reach) if $P_S$ is below a preselected threshold value, such as, for example, 0.1. For a hard state S, let $N_S$ denote the number of faults that require S for their detection. If $N_S>0$, then S is a hard and needed state. The detrimental effect of a hard and needed state S may be measured by computing a value $DE_S=(1-P_s)N_S$. That is, each of the $N_S$ faults which need state S are likely to be undetectable with probability $1-P_S$. If S is illegal, $DE_S$ achieves its maximum value, namely $N_S$. The detrimental effect of any two flip-flops A and B causing hard and needed states, therefore, is given by $$DE_{AB} = \sum_S DE_S, \qquad (4)$$

where S ranges over all the hard and needed states involving A and B. detrimental effect of a group G of flip-flops with a common clock is $$DE_G = \sum_{A,B} DE_{AB}, \qquad (5)$$

where the summation is done over all pairs of flip-flops in G causing hard and needed states. If F is the set of all flip-flops in the circuit, $DE_F$ is the circuit's total detrimental effect resulting from the common clocking.

FIG. 4 shows an illustrative partitioning procedure in accordance with one embodiment of the present invention. This partitioning procedure can operate in either of two modes. In the first mode, it attempts to create as many groups with independent clocks as are needed to reduce $DE_F$ to 0. Therefore, the number of groups, K, is bounded only by the number of flip-flops in the circuit. Specifically, the procedure in this mode attempts to obtain $DE_F=0$ with a minimal value of K. If the obtained K is considered too large (either by the user or based on an automated determination), then a second partitioning mode may be used, wherein the number of groups is limited by a user-specified K (which, again, could be based on an automated determination), such as, for example, 4. In this case, the goal is to minimize $DE_F$. Alternatively, of course, the user-specified K could be provided (or determined) a priori, and the first mode could be avoided altogether.

To accomplish the partitioning, the circuit may be advantageously modeled by a graph where each vertex (i.e., node) represents one flip-flop in the circuit. An edge (A,B) exists between two flip-flops A and B, if and only if $DE_{AB}>0$, i.e., the combination of flip-flops A and B contributes to the hard and needed states. Moreover, a weight of $DE_{AB}$ is assigned to each edge. Initially each group is empty. At the completion of the procedure, however, each flip-flop in the circuit is assigned to a group.

The illustrative procedure of FIG. 4 processes each of the edges of the graph in decreasing weight order as follows. For each unassigned flip-flop of the edge being processed, the procedure places the flip-flop in its "most favorable" group (if it has not already been assigned). A group G is said to be most favorable to flip-flop A, if placing A in G introduces a minimal increase in $DE_G$ as compared to placing A in other groups. In the first of the aforementioned modes, where the user has not specified a maximum number of groups, no increase is acceptable (i.e., the "minimal" increase must equal 0), since, in this mode, the goal is to reduce $DE_F$ to zero—if no such group is found, a new group is created and the flip-flop is placed therein. In either mode, this process is repeated for each of the edges in the graph. Note that upon the procedure's completion, flip-flops which had no edges associated with them may not have been assigned to any group. These flip-flops do not have any (identified) detrimental relation with any other flip-flop, and therefore, they can harmlessly be assigned to any arbitrary group.

Specifically, referring to FIG. 4, decision 40 initially determines which of the two aforementioned modes is being used. If the procedure is operating in the mode in which the user has not specified a maximum number of groups, step 41 creates one initial group. Otherwise, step 42 creates the user-specified number of groups, K. Then in step 43 the edges of the graph are rank ordered by their weights, and the first iteration of the primary execution loop begins.

The edge with the maximum weight is selected in step 44, and that edge is checked to identify a flip-flop i of that edge, which flip-flop has not yet been assigned to a group (decision 45). Assuming such a flip-flop is identified, the processing continues differently based on the mode in which the process is operating (decision 46). If the number of groups was not user-specified, step 48 places flip-flop i in a group, G, for which no increase in the group's detrimental effect value, $DE_G$, results therefrom, if any such group can be found. If there is no such group (decision 49), a new group is created for flip-flop i in step 50. In the case where the number of groups was user-specified, step 47 places flip-flop i in the "most favorable" group—i.e., the group for which a minimum increase in its detrimental effect value, $DE_G$, results from adding flip-flop i thereto.

After flip-flop i has been assigned to a group, flow returns to decision 45 to continue processing for any other unassigned flip-flop of the given edge, if any. If all (i.e., both) of the flip-flops of that edge have been assigned, the edge is removed from the graph in step 51, and decision 52 determines if there are more edges to process. If so, control returns to the beginning of the primary loop (i.e., step 44). If not, step 53 places any remaining (i.e., unassigned) flip-flops into arbitrary groups.

Figure 5:
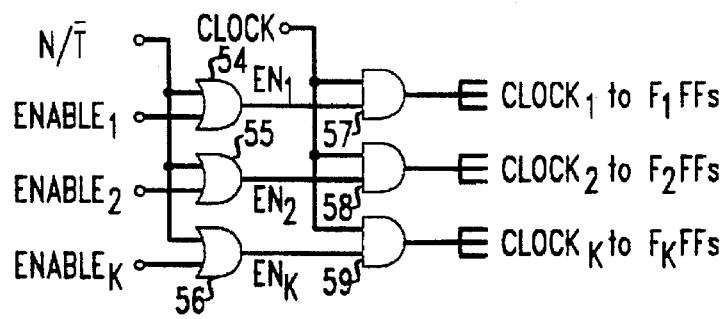
FIG. 5 shows a first illustrative implementation of an approach to clock gating in accordance with an illustrative embodiment of the present invention.

As a result of the above described illustrative procedure, the flip-flops of a given circuit are partitioned into several groups, such that each group may be advantageously controlled by an independent clock during testing. In accordance with one illustrative embodiment of the present invention, this may be achieved by gating the original clock signal based on a first illustrative implementation as shown in FIG. 5. This first illustrative implementation operates as follows. In the "normal" (as opposed to the testing) mode of operation, signal N/T is held at a logic 1 value. In this manner, each flip-flop (not shown in the figure) receives the common system clock (i.e., $CLOCK_i$=CLOCK). In the test mode, however, signal N/T is set to a logic 0 value, thereby enabling the independent operation of each clock signal, $CLOCK_i$, based on its corresponding enabling signal, $ENABLE_i$. Note that this DFT technique advantageously does not introduce any delay penalty. However, this implementation may, in some cases, lead to clock skew problems, since the original clock distribution is modified by the addition of gates 57, 58 and 59, and the fanout therefrom.

Figure 6:
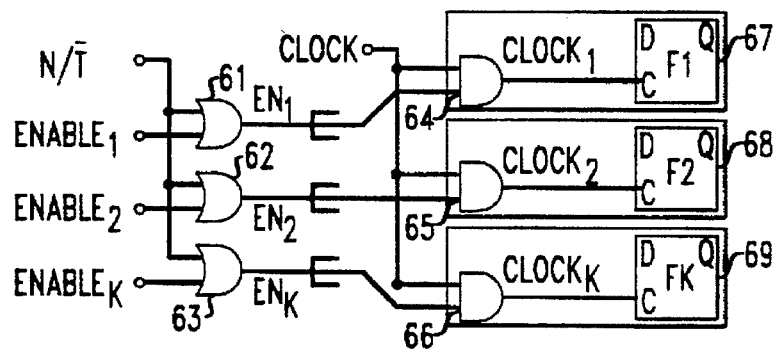
FIG. 6 shows a second illustrative implementation of an approach to clock gating in accordance with an illustrative embodiment of the present invention.

FIG. 6 shows a second illustrative implementation in accordance with an illustrative embodiment of the present invention, which implementation overcomes the potential clock skewing problem by distributing the enabling signals rather than the gated clocks, and by placing clock gating AND gates 64, 65 and 66 adjacent to the controlled flip-flops. That is, in this case, enabling gates 61, 62 and 63 provide the fanout to each corresponding group of flip-flops. Therefore, the routing of the original CLOCK signal need not be changed, and the potential clock skew problem may thereby be advantageously avoided. Note that in a standard-cell ASIC (Application Specific Integrated Circuit) circuit implementation, it may be advantageous to provide the clock control gate as part of the flip-flop cell itself.

Figure 7:
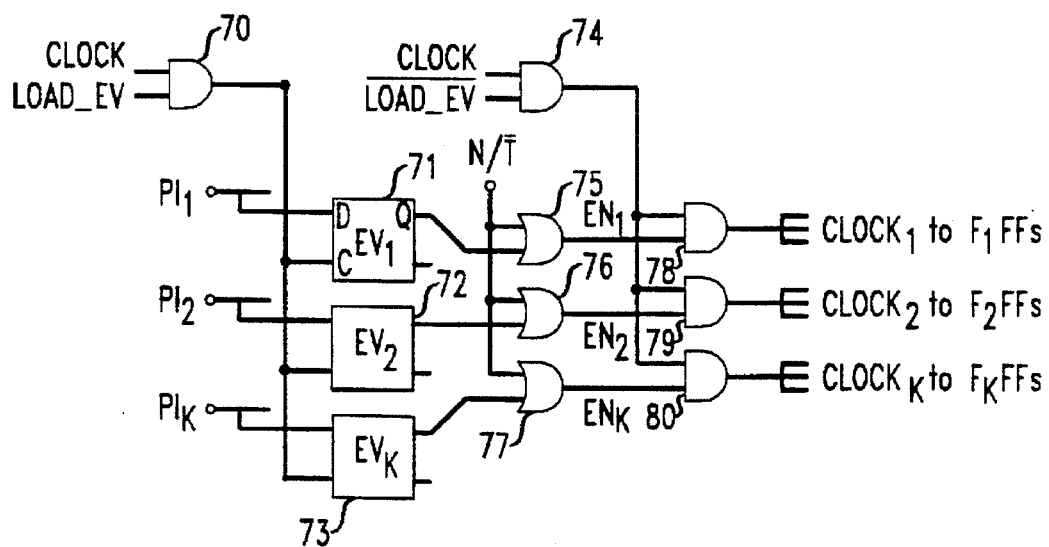
FIG. 7 shows a third illustrative implementation of an approach to clock gating in accordance with an illustrative embodiment of the present invention.

An additional problem may be faced by the circuit designer if the number K of the ENABLE signals which has been determined in accordance with an illustrative embodiment of the present invention described above is greater than the number of pins which are available for added external connections (i.e., test mode primary inputs). FIG. 7 shows a third illustrative implementation of an approach to clock gating in accordance with an illustrative embodiment of the present invention, which implementation advantageously overcomes this problem by introducing K additional flip-flops (flip-flops 71, 72 and 73 in the figure) in which the enabling values may be temporarily stored. During the normal (i.e., non-test) mode of operation, signal N/T is held at a logic 1 value, and signal LOAD_EV (load enabling value) is held at a logic 0 value. This results in each flip-flop in the original circuit (not shown in the figure) receiving the common system clock (i.e., $CLOCK_i$=CLOCK) through AND gates 78, 79 and 80, since OR gates 75, 76 and 77 have been disabled. During testing, however, signal N/T is set to a logic 0 value, and every $CLOCK_i$ is enabled only when the flip-flop's corresponding $EV_i$ signal is a logic 1. The enabling values may be advantageously loaded by setting signal LOAD_EV to a logic 1, which also ensures that the $CLOCK_i$ signals are inactive for all the flip-flops in the original circuit, by disabling AND gates 78, 79 and 80 (due to AND gate 74). Therefore, the state of the circuit does not change during the loading process. Note that the test generator can advantageously generate sequences assuming that each clock has an individual enabling primary input. Then, after the test sequences have been generated, one additional vector is inserted therein to load the appropriate set of enabling values whenever the set of active clocks changes.

Moreover, as will be obvious to those skilled in the art, the approaches of the illustrative implementations shown in FIGS. 6 and 7 may be advantageously combined to both reduce additional pin requirements and to avoid clock skew problems. As can be seen from the two figures, for a circuit with N flip-flops, the cost (i.e., in additional components and pins) of applying this illustrative third implementation and avoiding clock skew is 2 primary inputs, K enable flip-flops, K OR gates, and N+2 AND gates.

Although a number of specific embodiments of this invention have been shown and described herein, it is to be understood that these embodiments are merely illustrative of the many possible specific arrangements which can be devised in application of the principles of the invention. Numerous and varied other arrangements can be devised in accordance with these principles by those of ordinary skill in the art without departing from the spirit and scope of the invention. For example, although both the illustrative joint probability estimation procedure and the illustrative partitioning procedure described in detail above were described as being applied to flip-flop pairs, it will be obvious to those skilled in the art that the principles of the present invention in general and these procedures in particular may be extended to apply to flip-flop n-tuples of any size. (In order to extend the partitioning procedure, for example, edges in the graph, which represent pairs of flip-flops, may easily be replaced by generalized n-tuples of flip-flops. Otherwise the procedure operates in essentially the same manner as described above and shown in FIG. 4.)

In addition, it will be obvious to those skilled in the art that the method of the present invention may be advantageously combined with other DFT methods. For example, clock partitioning alone may be inadequate if used on a circuit that is not initializable. Thus, it may be advantageous to combine the techniques of the present invention with one or more other (conventional) DFT techniques with complementary strengths. Such conventional DFT methods include, for example, partial or full scan, the use of partial reset, and the use of partial observation techniques, each of which is familiar to those of ordinary skill in the art. (In partial reset, a subset of the flip-flops receive an additional primary input which is used as a direct set or reset signal. In partial observation, a subset of flip-flops are typically XOR'd together and connected to one additional output. The selection of the partial reset and partial observation flip-flops may be based on any of a number of conventional methods, such as, for example, those presented in P. Parikh and M. Abramovici, "On Combining DFT Techniques", Proc. Int'l. Test Conf., pp. 423–429, 1995. Note also that when partial observation is used, the flip-flops can be observed either at the D-input or at the Q-output. It is well known that in a single-clock circuit, observing the D-inputs will provide the same fault coverage as observing the Q-outputs, except that one additional clock vector is needed at the end: and that in a multi-clock circuit, observing the D-inputs is likely to be much more beneficial than observing Q-outputs, since if fault effects reach D-inputs of flip-flops that are not currently clocked, the faults are detected if the D-inputs are observed, but they are not detected by the current vector if the Q-outputs are observed instead.) In one illustrative embodiment of the present invention, for example, the techniques of the present invention are advantageously combined with certain other DFT techniques as follows: first, partial reset techniques are applied to the original circuit; second, partial observation techniques are applied to the circuit resultant therefrom; and third, the illustrative method described above in accordance with the present invention is applied to the circuit which results from the application of both the partial reset and the partial observation techniques.

Finally, it will also be obvious to those skilled in the art that the techniques of the present invention may be applied when the original sequential circuit has more than one independent clock. In particular and in accordance with an illustrative embodiment of the present invention, each set of flip-flops sharing a common clock line may, for example, be individually partitioned according to the principles and methods described above.

We claim:

1. An automated method of increasing the testability of a sequential circuit design, the sequential circuit design comprising a plurality of clocked flip-flops, the sequential circuit design having a plurality of possible circuit states thereof, each of said circuit states being defined by a set of one or more of said flip-flops having a particular set of logic values assigned thereto, the method comprising the steps of:

identifying a difficult-to-reach circuit state based on a measure of difficulty of achieving said circuit state, the difficult-to-reach circuit state being defined by a set of two or more of said flip-flops and corresponding values assigned thereto, at least two of the two or more flip-flops being clocked by a common clock line;

partitioning the set of at least two of the two or more flip-flops into a plurality of flip-flop groups; and modifying the sequential circuit design to produce a modified design comprising a plurality of clock lines, each of which is capable of being activated independently of one or more of the other clock lines, and wherein flip-flops which have been partitioned into different flip-flop groups are clocked by different clock lines.

2. The method of claim 1 wherein generation of a test for one or more faults of the sequential circuit design requires achieving the identified difficult-to-reach circuit state.

3. The method of claim 2 further comprising the step of determining a number of faults of the sequential circuit design which require achieving the identified difficult-to-reach circuit state.

4. The method of claim 1 wherein the measure of difficulty of achieving the identified circuit state comprises a joint probability that each of the two or more flip-flops in the set which defines the identified circuit state achieves the corresponding values assigned thereto.

5. The method of claim 4 wherein the step of identifying the difficult-to-reach circuit state comprises estimating the joint probability that each of the two or more flip-flops in the set which defines the identified circuit state achieves the corresponding value assigned thereto, and comparing said estimate to a predetermined threshold value.

6. The method of claim 5 wherein the step of estimating the joint probability comprises computing a solution to a system of equations, wherein one or more of the equations represents a relationship between a line probability of a given flip-flop and one or more line probabilities of other flip-flops which drive the given flip-flop.

7. The method of claim 1 wherein each flip-flop in the set of at least two of the two or more flip-flops is partitioned into a different flip-flop group.

8. The method of claim 1 further comprising the step of receiving from a user a parameter representing a maximum permitted number of partitions, and wherein the partitioning step limits in number the plurality of flip-flop groups to said maximum permitted number of partitions.

9. The method of claim 1 wherein the step of modifying the sequential circuit design comprises adding a plurality of enable lines, wherein each of the enable lines permits activation of one or more of the plurality of clock lines.

10. The method of claim 9 wherein the step of modifying the sequential circuit design further comprises adding one or more flip-flops corresponding to one or more of said enable lines, and wherein one or more of said enable lines may be activated by storing a value in a corresponding one of said added flip-flops.

\* \* \* \* \*